(12) United States Patent
Rhee et al.

(10) Patent No.: US 9,551,593 B2
(45) Date of Patent: Jan. 24, 2017

(54) METHOD AND APPARATUS FOR DISPLAYING POWER CONSUMPTION

(75) Inventors: Young-ho Rhee, Gyeonggi-do (KR); Young-kyu Jin, Seoul (KR); Jong-woo Jung, Gyeonggi-do (KR); Yeo-jin Kim, Gyeonggi-do (KR); Il-ku Chang, Seoul (KR)

(73) Assignee: Samsung Electronics Co., Ltd (KR)

( * ) Notice: Subject to any disclaimer, the term of this patent is extended or adjusted under 35 U.S.C. 154(b) by 1112 days.

(21) Appl. No.: 13/085,840

(22) Filed: Apr. 13, 2011

(65) Prior Publication Data

US 2011/0252261 A1 Oct. 13, 2011

(30) Foreign Application Priority Data

Apr. 13, 2010 (KR) .................. 10-2010-0033909

(51) Int. Cl.
*G01D 4/00* (2006.01)
*G01R 22/10* (2006.01)
*G06F 11/30* (2006.01)

(52) U.S. Cl.
CPC .......... *G01D 4/00* (2013.01); *G01R 22/10* (2013.01); *G06F 11/3062* (2013.01); *Y04S 20/44* (2013.01)

(58) Field of Classification Search
CPC G06F 17/30256; G06F 1/3203; G06F 1/3206; G06F 11/3062; H04L 67/18; G06Q 50/06
USPC .......... 713/300, 320, 340; 705/412; 715/767
See application file for complete search history.

(56) References Cited

U.S. PATENT DOCUMENTS

| | | |
|---|---|---|
| 2002/0030478 A1 | 3/2002 | Nagamitsu et al. |
| 2005/0190074 A1* | 9/2005 | Cumeralto ............ G01D 4/006 340/870.02 |
| 2005/0264482 A1* | 12/2005 | Suzuki et al. .................. 345/63 |
| 2007/0216362 A1 | 9/2007 | Kwit |
| 2007/0217650 A1* | 9/2007 | Ota et al. ....................... 382/100 |
| 2007/0279244 A1* | 12/2007 | Haughawout et al. .. 340/825.22 |
| 2008/0167756 A1* | 7/2008 | Golden ................. G05B 15/02 700/297 |
| 2008/0218307 A1 | 9/2008 | Schoettle |
| 2008/0224892 A1* | 9/2008 | Bogolea et al. ........... 340/870.3 |
| 2008/0272934 A1* | 11/2008 | Wang et al. ............ 340/870.11 |
| 2009/0195349 A1* | 8/2009 | Frader-Thompson . G01D 4/002 340/3.1 |
| 2009/0281886 A1* | 11/2009 | Castelli et al. ............ 705/14.17 |
| 2009/0319905 A1 | 12/2009 | Loeb et al. |

(Continued)

FOREIGN PATENT DOCUMENTS

| | | |
|---|---|---|
| JP | 2007272268 | 10/2007 |
| JP | 2008092681 | 4/2008 |

(Continued)

OTHER PUBLICATIONS

European Search Report dated Apr. 8, 2015 issued in counterpart application No. 11769080.0-1558.

*Primary Examiner* — Kim Huynh
*Assistant Examiner* — Brandon Kinsey
(74) *Attorney, Agent, or Firm* — The Farrell Law Firm, P.C.

(57) ABSTRACT

A method of displaying power consumption by receiving information regarding Real Time Pricing (RTP) in which a power rate varies according to time; receiving power consumption amounts; and displaying predetermined visual displaying means based on the RTP information and the received power consumption amounts.

33 Claims, 17 Drawing Sheets

(56) References Cited

U.S. PATENT DOCUMENTS

| | | | |
|---|---|---|---|
| 2010/0017045 A1 | 1/2010 | Nesler et al. | |
| 2010/0060479 A1* | 3/2010 | Salter | |
| 2010/0070434 A1* | 3/2010 | Cooper et al. | 705/412 |
| 2011/0046805 A1* | 2/2011 | Bedros et al. | 700/291 |
| 2011/0106327 A1* | 5/2011 | Zhou et al. | 700/291 |

FOREIGN PATENT DOCUMENTS

| | | |
|---|---|---|
| KR | 1020020061981 | 7/2002 |
| KR | 100541359 | 12/2005 |
| KR | 1020100023618 | 3/2010 |

* cited by examiner

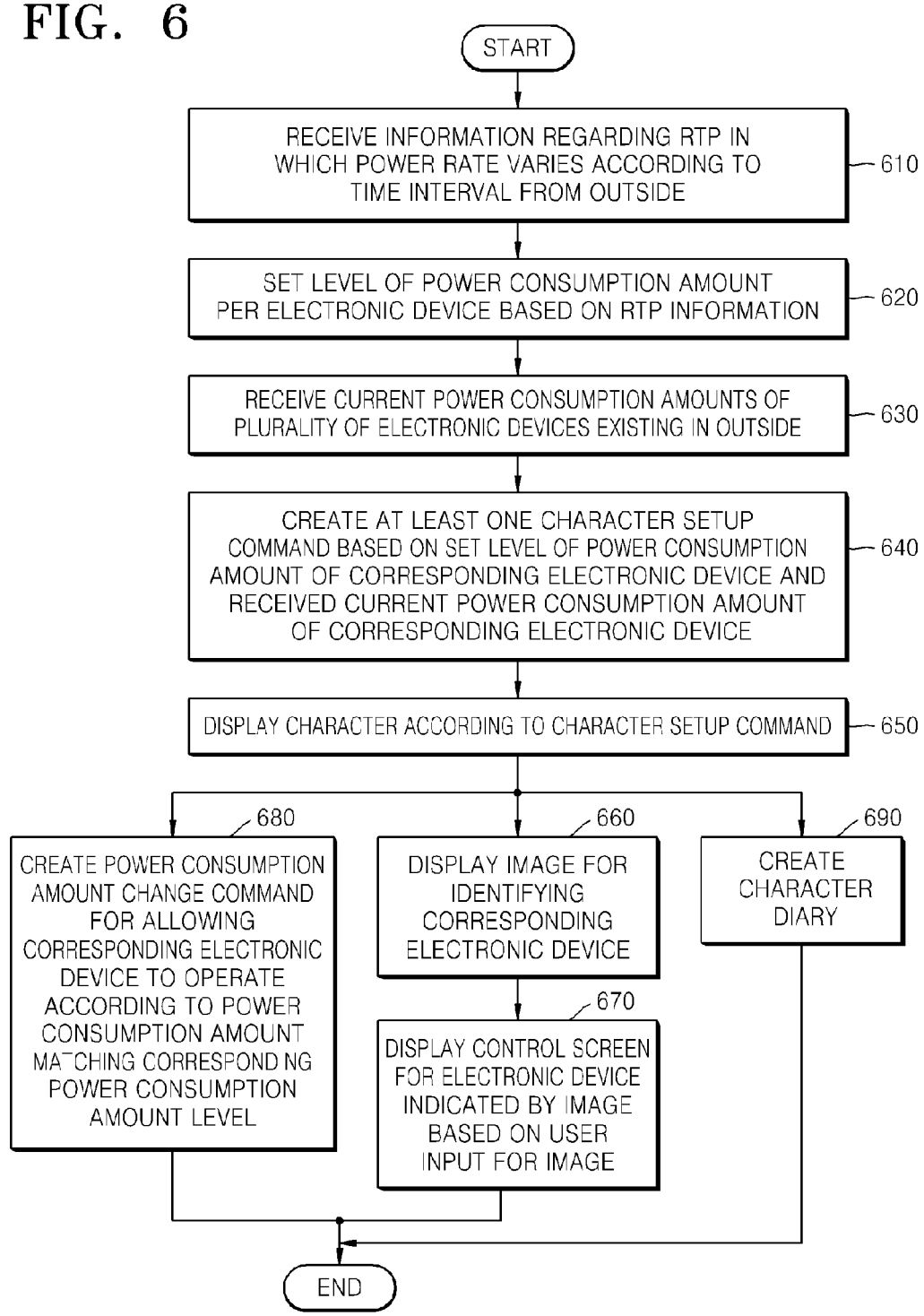

FIG. 7

| DR LEVEL<br>ELECTRONIC DEVICE | DR LEVEL 1 | DR LEVEL 2 | DR LEVEL 3 | DR LEVEL 4 |
|---|---|---|---|---|
| AIR CONDITIONER | 4170W | 3000W | 1500W | 164W |
| | NORMAL OPERATION | TEMPERATURE 2°↑ | TEMPERATURE 4°↑ | VENTILATING OPERATION |
| REFRIGERATOR | 270W | 240W | 150W | 120W |
| | NORMAL OPERATION | FREEZER TEMPERATURE 1°↑ | FREEZER TEMPERATURE 2°↑ | FREEZER TEMPERATURE 4°↑ |
| TV | 105W | 80W | 60W | 32W |
| | NORMAL OPERATION | BACKLIGHT LUMINANCE↓ | VOLUME↓ | OFF |
| LED LIGHTING | 20W | 16W | 10W | 6W |
| | NORMAL OPERATION | DIMMING CONTROL 80% | DIMMING CONTROL 40% | DIMMING CONTROL 0% |

FIG. 8

| RTP LEVEL<br>DEVICE | RTP LEVEL 1 | RTP LEVEL 2 | RTP LEVEL 3 | RTP LEVEL 4 |
|---|---|---|---|---|
| AIR CONDITIONER | ■ DR level 1<br>☐ DR level 2<br>☐ DR level 3<br>☐ DR level 4 | ☐ DR level 1<br>■ DR level 2<br>☐ DR level 3<br>☐ DR level 4 | ☐ DR level 1<br>☐ DR level 2<br>■ DR level 3<br>☐ DR level 4 | ☐ DR level 1<br>☐ DR level 2<br>☐ DR level 3<br>■ DR level 4 |
| REFRIGERATOR | ■ DR level 1<br>☐ DR level 2<br>☐ DR level 3<br>☐ DR level 4 | ☐ DR level 1<br>■ DR level 2<br>☐ DR level 3<br>☐ DR level 4 | ☐ DR level 1<br>☐ DR level 2<br>■ DR level 3<br>☐ DR level 4 | ☐ DR level 1<br>☐ DR level 2<br>☐ DR level 3<br>■ DR level 4 |
| TV | ■ DR level 1<br>☐ DR level 2<br>☐ DR level 3<br>☐ DR level 4 | ☐ DR level 1<br>■ DR level 2<br>☐ DR level 3<br>☐ DR level 4 | ☐ DR level 1<br>☐ DR level 2<br>■ DR level 3<br>☐ DR level 4 | ☐ DR level 1<br>☐ DR level 2<br>☐ DR level 3<br>■ DR level 4 |
| LED LIGHTING | ■ DR level 1<br>☐ DR level 2<br>☐ DR level 3<br>☐ DR level 4 | ■ DR level 1<br>☐ DR level 2<br>☐ DR level 3<br>☐ DR level 4 | ■ DR level 1<br>☐ DR level 2<br>☐ DR level 3<br>☐ DR level 4 | ☐ DR level 1<br>■ DR level 2<br>☐ DR level 3<br>☐ DR level 4 |

FIG. 9

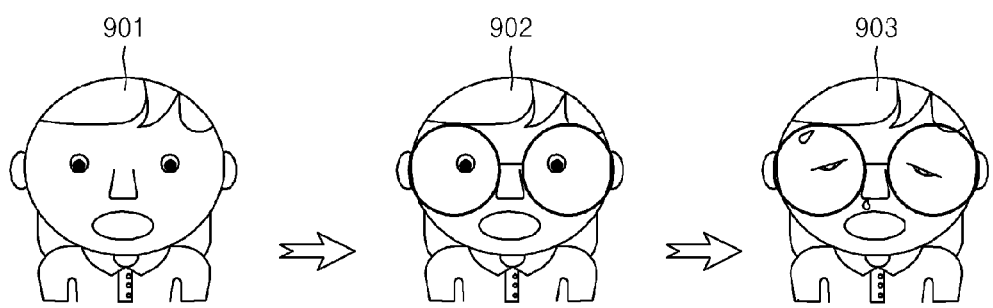

METHOD AND APPARATUS FOR DISPLAYING POWER CONSUMPTION

PRIORITY

This application claims priority under 35 U.S.C. §119(a) to an application filed in the Korean Intellectual Property Office on Apr. 13, 2010 and assigned Serial No. 10-2010-0033909, the entire disclosure of which is incorporated herein by reference.

BACKGROUND OF THE INVENTION

1. Field of the Invention

The present invention relates generally to a method and apparatus for displaying power consumption, and more particularly, to a method and apparatus for displaying power consumption to intuitively provide information regarding the power consumption by using a character.

2. Description of the Related Art

At present, a method of displaying a power consumption amount in the inside or outside of a house quantitatively displays the power consumption amount, a power rate corresponding thereto, and an amount of carbon dioxide generation by using a bar graph or a pie graph.

SUMMARY OF THE INVENTION

An aspect of the present invention is to provide a method and apparatus for displaying power consumption to provide a character or an image changed according to a power consumption amount of each electronic device.

According to an aspect of the present invention, there is provided a method of displaying power consumption, by receiving information regarding Real Time Pricing (RTP) in which a power rate varies according to time; receiving power consumption amounts; and displaying predetermined visual displaying means based on the RTP information and the received power consumption amounts.

According to another aspect of the present invention, there is provided a method of displaying power consumption in a terminal including a camera, by receiving information regarding Real Time Pricing (RTP) in which a power rate varies according to a predetermined time interval from the outside; receiving power consumption amounts of at least one of electronic device; switching the camera to a live-view mode; and changing color information of an electronic device displayed on the terminal based on the based on the RTP information and the received power consumption amounts.

According to another aspect of the present invention, there is provided an apparatus for displaying power consumption, which includes a receiver for receiving information regarding Real Time Pricing (RTP) in which a power rate varies according to time and power consumption; a controller for creating predetermined visual displaying means based on the RTP information and the received power consumption amounts; and a display unit for displaying the predetermined visual displaying means.

According to another aspect of the present invention, there is provided an apparatus for displaying power consumption in a terminal including a camera, the apparatus including a receiver for receiving information regarding Real Time Pricing (RTP) in which a power rate varies according to a predetermined time interval from the outside and power consumption amounts of at least one of electronic device; and a controller for switching the camera to a live-view mode and changing color information of an electronic device displayed on the terminal based on the based on the RTP information and the received power consumption amounts.

According to yet another aspect of the present invention, there is provided a computer-readable recording medium storing a computer-readable program for executing methods of displaying power consumption, as described above.

BRIEF DESCRIPTION OF THE DRAWINGS

The above and other aspects, features and advantages of certain embodiments of the present invention will become more apparent from the following description taken in conjunction with the accompanying drawings, in which:

FIG. 6 is a flow diagram illustrating a method of displaying power consumption according to another embodiment of the present invention;

FIG. 7 is a table illustrating Demand Response (DR) levels set according to an embodiment of the present invention;

FIG. 8 is a table illustrating DR levels per electronic device, which are set according to RTP levels, according to an embodiment of the present invention;

FIG. 9 is a diagram illustrating an avatar;

DETAILED DESCRIPTION OF EMBODIMENTS OF THE PRESENT INVENTION

Various embodiments of the present invention will now be described in detail with reference to the accompanying drawings. In the following description, descriptions of well-known functions and constructions are omitted for clarity and conciseness.

Figure 1:
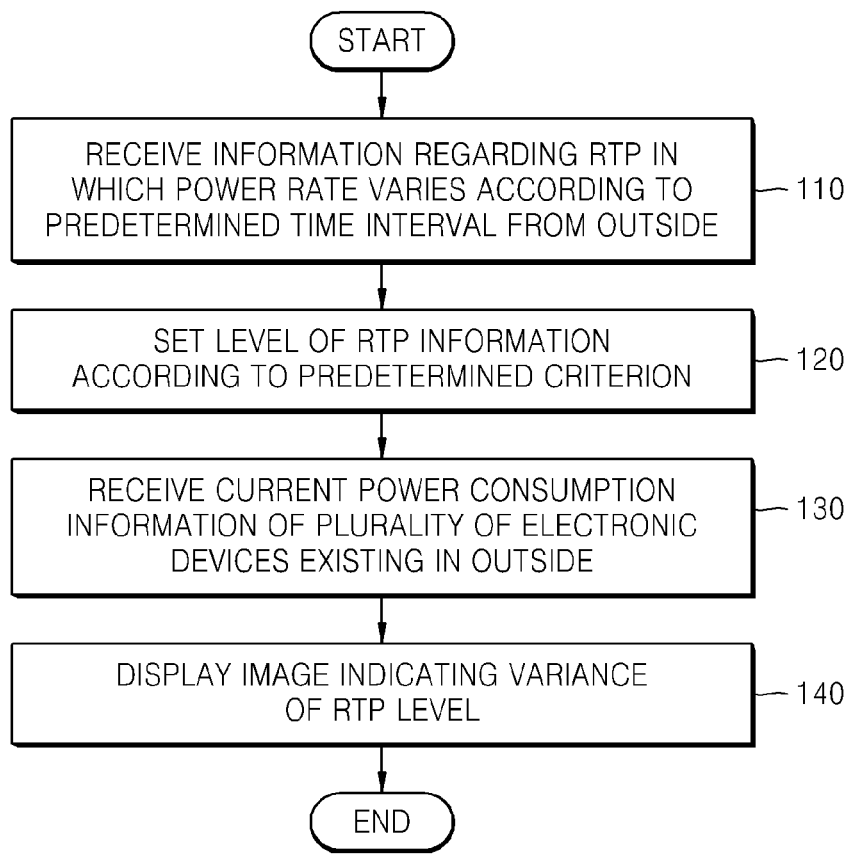
FIG. 1 is a flow diagram illustrating a method of displaying power consumption, according to an embodiment of the present invention.

FIG. 1 is a flow diagram illustrating a method of displaying power consumption, according to an embodiment of the present invention.

Referring to FIG. 1, in step 110, an apparatus for displaying power consumption receives information regarding RTP in which a power rate varies according to a predetermined time interval from the outside. RTP means a power rate according to time, which is defined by a power company (e.g., Korea Electric Power Corporation (KEPCO) in Korea).

In step 120, the apparatus for displaying power consumption sets a level of the RTP information according to a predetermined criterion.

Figure 2:
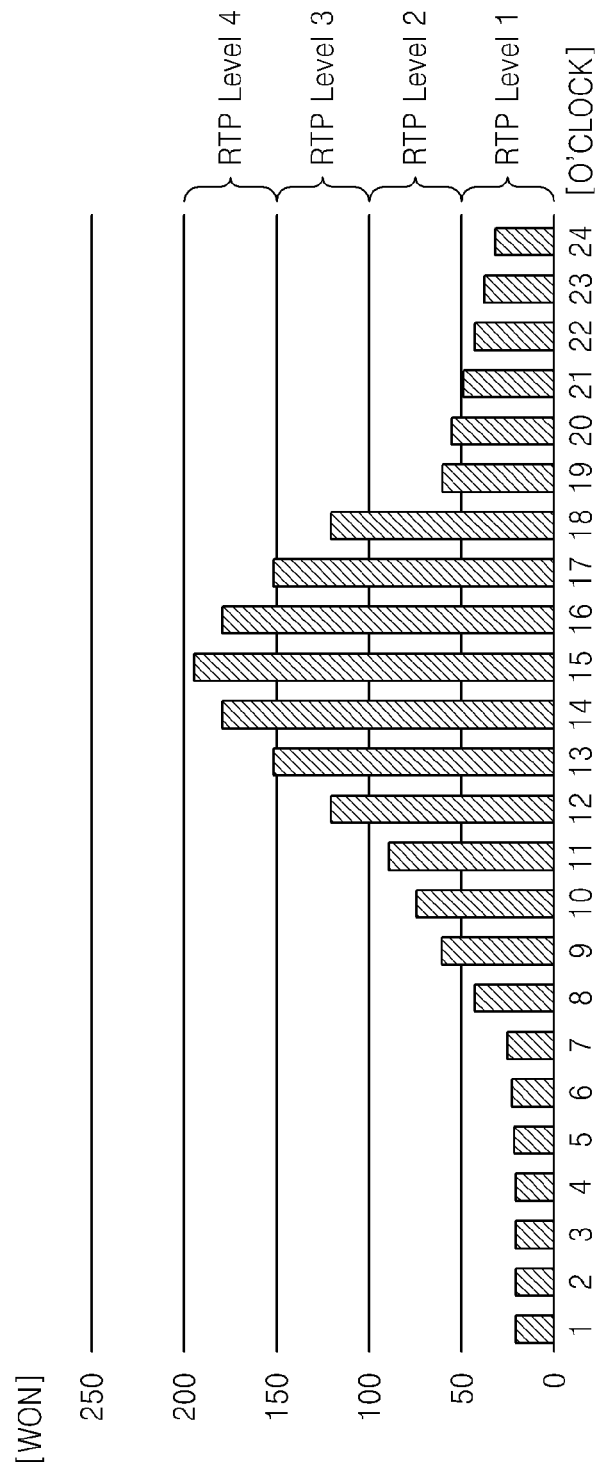
FIG. 2 is a graph illustrating RTP according to an embodiment of the present invention.

FIG. 2 is a graph showing RTP according to an embodiment of the present invention.

Referring to FIG. 2, the horizontal axis indicates time, and the vertical axis indicates a power rate. The horizontal axis shows 24 hours, and the vertical axis shows a power rate per KWh. A low RTP level, i.e., an RTP level 1, is set in a case of Won/KWh<50, an intermediate RTP level, i.e., an RTP level 2, is set in a case of 50≤Won/KWh<100, a high RTP level, i.e., an RTP level 3, is set in a case of 100≤Won/KWh<150, and the highest RTP level, i.e., an RTP level 4, is set in a case of 150≤Won/KWh. As the RTP level increases, the power rate increases. In FIG. 2, RTP level 1 is set from 1:00 to 8:00 and from 21:00 to 24:00, RTP level 2 is set from 9:00 to 12:00 and from 19:00 to 20:00, RTP level 3 is set from 12:00 to 18:00, and RTP level 4 is set from 13:00 to 17:00. Accordingly, when power is consumed from 13:00 to 17:00 corresponding to RTP level 4, power is consumed at the highest price. RTP may be changed by a power company, and the RTP levels may also be arbitrarily changed by a manufacturer or user of the apparatus for displaying power consumption.

Referring back to FIG. 1, in step 130, the apparatus for displaying power consumption receives current power consumption information of a plurality of electronic devices existing outside. For example, the outside may be a house or a company building. The power consumption information may be an entire power consumption amount in the outside. Alternatively the power consumption information may be a current power consumption amount of each electronic device. For example, if it is assumed that a washing machine, a TV, a refrigerator, an air conditioner, and lighting are the electronic devices inside a house, current power consumption amounts of these electronic devices are received. In general, a current power consumption amount indicates a power consumption amount of a certain electronic device in a unit of minutes. The time for satisfying the meaning of current consumption is set as a time used by a user or commonly used in the power technology field. As a method of receiving power consumption information in the apparatus for displaying power consumption, the power consumption information may be received from each electronic device, a device for measuring a power consumption amount, which is attached to a power terminal of each electronic device, or a device for measuring integrated power consumption, which is connected to each electronic device. There is no device limitation to a method of receiving power consumption information.

In step 140, the apparatus for displaying power consumption displays an image indicating a variance of an RTP level. The image may be implemented by flash animation. That is, the image may be implemented by an image changed according to the RTP level. If the RTP level is changed from RTP level 1 to RTP level 2, the power rate per hour increases. Here, if a user sets a target amount for a power rate, a problem may occur to the target amount, so an image for indicating a problem to an increase in a power rate per hour or a user target amount may be displayed.

Figure 3A:
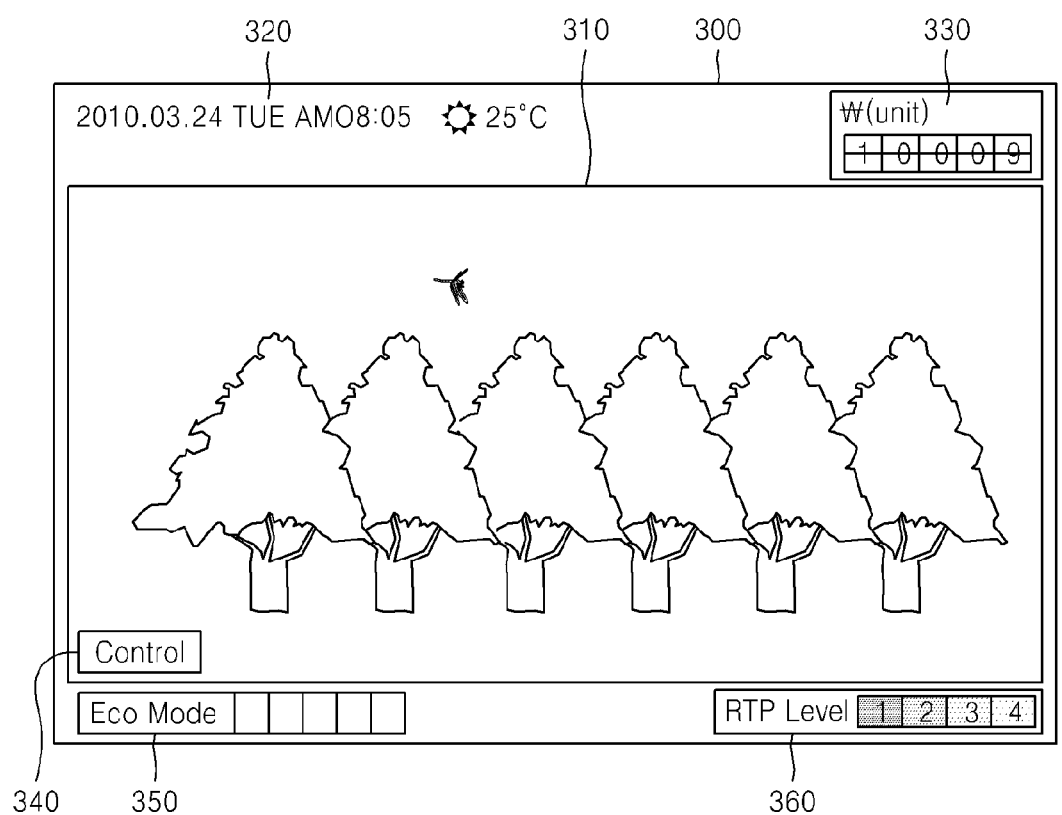
FIGS. 3A and 3B illustrate a power consumption displaying application according to the method of FIG. 1.
Figure 3B:
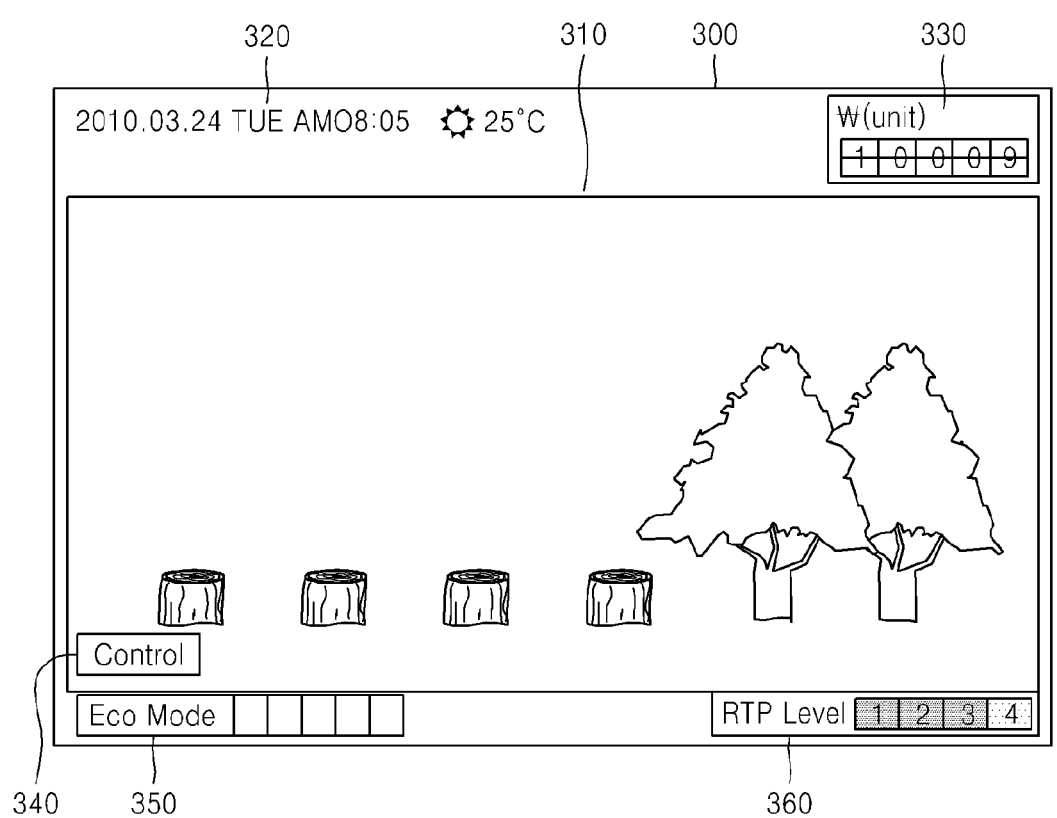

FIGS. 3A and 3B illustrate a power consumption displaying application 300 in the method of FIG. 1.

Referring to FIG. 3A, the power consumption displaying application 300 provides an image 310 changed according to a current power consumption amount based on an RTP level 360. The RTP level 360 is a level assumed in FIG. 2 and indicates that a power rate per hour increases as the RTP level 360 increases. In FIG. 3A, the image 310 indicating the RTP level 1 is shown as an image with a lot of trees. The power consumption displaying application 300 may provide a current time 320. The power consumption displaying application 300 may further provide an icon indicating weather since the weather may be an important element when RTP is provided by a power company. The power consumption displaying application 300 may further provide a power consumption information-related item 330. In the power consumption information-related item 330, any one of current usage fee information in a unit of Won (\), expected fee information, average daily usage fee information, power consumption amount information in a unit of KWh, and a carbon dioxide usage amount may be provided in a form of a flip. These pieces of information may be provided in a form of toggle. A time interval may be arbitrarily set by a user based on year/month/week/day. An average daily usage fee is calculated by dividing a value obtained by subtracting a usage fee till a current day of a current month from a target monthly fee by a value obtained by subtracting a current date from a date corresponding to one month. And expected fee may be calculated based on RTP and a power consumption amount. The power consumption displaying application 300 may further provide a control button 340. If the control button 340 is selected by the user, an avatar corresponding to each electronic device is displayed. To do this, the embodiment of FIG. 6 is implemented, as will be described later. A flickering motion may be displayed in a case of a large power consumption amount. When an Eco Mode item 350 is selected by the user, all the electronic devices are controlled so that all the electronic devices operate according to a level of a power consumption amount per electronic device based on RTP levels set for all the electronic devices, as will also be described later.

FIG. 3B shows a case where the RTP level 360 is changed to a higher level than FIG. 3A, that is, a case of a level indicating a high power rate. In FIG. 3B, the RTP level 360 indicates the RTP level 4, and if the electronic devices keep operating as they are, a power rate may be too high to exceed a target fee of the user, so the image 310 indicating the RTP level 4 is shown as an image with a few trees. If the RTP level 360 goes down, the image 310 may be shown as an image with a lot of trees.

The power consumption displaying application 300 may further provide a menu for an energy usage amount and an energy usage target amount.

Figure 4:
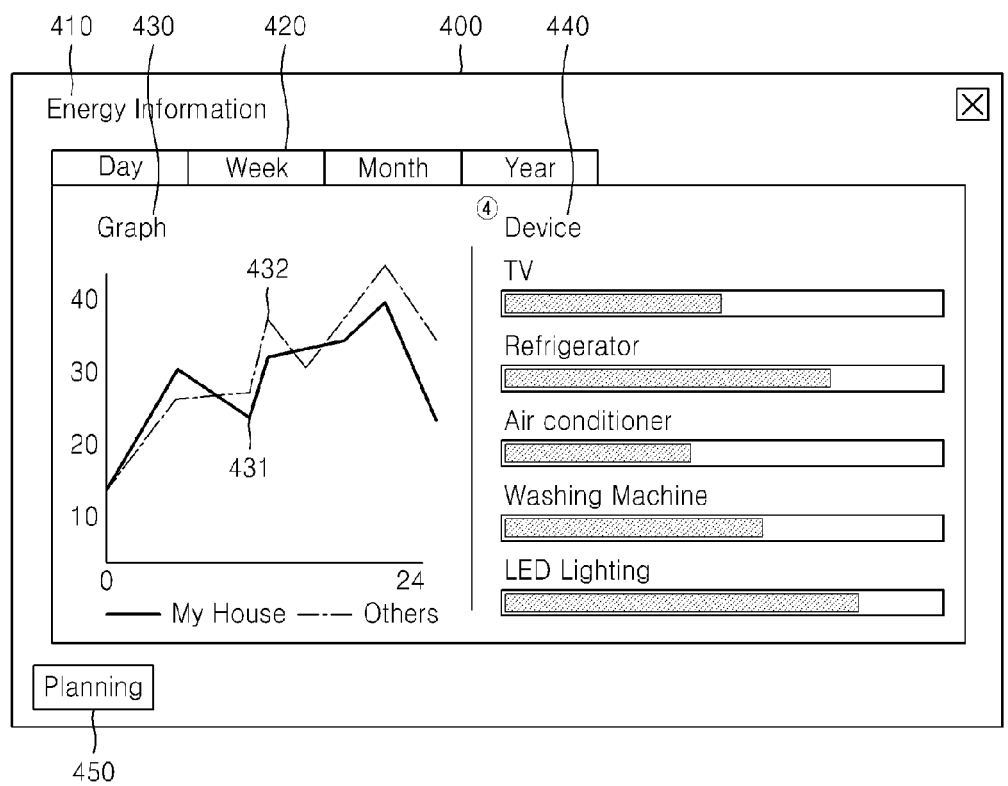
FIG. 4 is a diagram illustrating an energy usage amount application according to an embodiment of the present invention.

FIG. 4 is a diagram illustrating an energy usage amount application according to an embodiment of the present invention.

Referring to FIG. 4, a power consumption displaying application 400 displays an energy usage amount title 410. The power consumption displaying application 400 provides a period item 420 for identifying Day, Week, Month, and Year and provides information regarding a corresponding period. The power consumption displaying application 400 provides an energy usage amount 431 of a predetermined house and an energy usage amount 432 of others as a graph 430. The graph 430 shows an accumulated energy usage amount according to the period item 420. The power consumption displaying application 400 also provides an energy usage amount 440 per device, and if any device is selected, the power consumption displaying application 400 may display a control screen of the selected device. The power consumption displaying application 400 also provides an energy usage target amount setup button 450 where a user may select and set an energy usage target amount.

Figure 5:
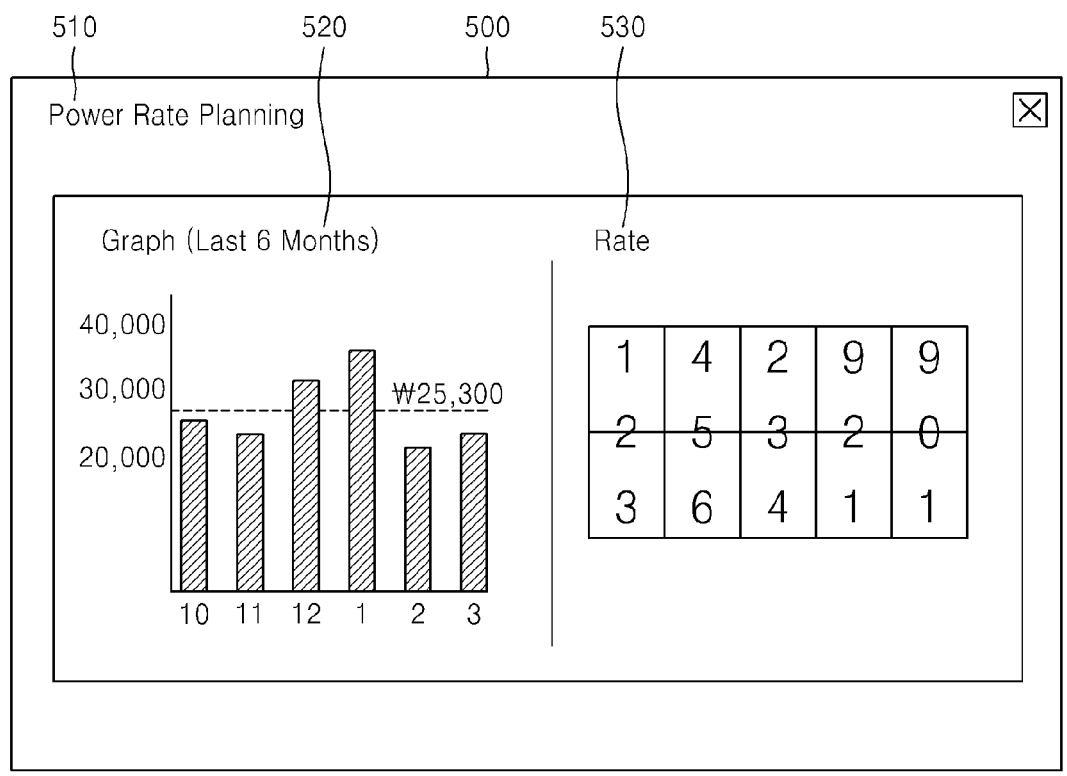
FIG. 5 is a diagram illustrating an energy usage target amount application according to an embodiment of the present invention.

FIG. 5 is a diagram illustrating an energy usage target amount application according to an embodiment of the present invention.

Referring to FIG. 5, a power consumption displaying application 500 displays an energy usage target amount title 510. The power consumption displaying application 500 provides monthly power rates and an average power rate of last 6 months as a graph 520. This period may be changed by a user. In the power consumption displaying application 500, the user may set a target amount with a numerical value.

FIG. 6 is a flow diagram illustrating a method of displaying power consumption according to an embodiment of the present invention. The method of FIG. 6 may be executed after the method of FIG. 1 or may be executed independently.

Referring to FIG. 6, in step 610, an apparatus for displaying power consumption receives information regarding RTP in which a power rate varies according to a predetermined time interval from the outside through a predetermined communication network. Step 610 is identical to step 110 of FIG. 1 and may include step 120 thereof.

In step 620, the apparatus for displaying power consumption sets a level of a power consumption amount per electronic device based on the RTP information. First, a criterion level of a power consumption amount per electronic device is set. The criterion level of a power consumption amount per electronic device may be defined by a manufacturer or a user of each electronic device. In an embodiment of the present invention, the criterion level of a power consumption amount per electronic device indicates a Demand Response (DR) level, i.e., a level of a price to a current power demand. The DR indicates an action for changing a power consumption pattern of a customer through a fee incentive payment means designed to rationally use or reduce power in response to a change of a power rate according to time and a price jump or a decrease of reliability. That is, if a power rate system is changed to RTP, a power company provides an incentive to change the power consumption pattern of a customer. That is, the DR indicates a voluntary action of a customer to adjust an energy usage amount or an energy usage time band of the customer, mainly affects an action of the customer by a market price or incentive, and aims at a short-term decrease of power consumption. Examples of the DR are RTP, an emergent load cut-off program, a self-contract DR program, a demand bid program, and a direct load control, and in an embodiment of the present invention, the DR mainly indicates RTP. An electronic device manufacturer, an electronic device user, or a manufacturer of the apparatus for displaying power consumption may set a DR level based on a power rate according to an accumulated or current power consumption amount by using a DR program.

FIG. 7 is a table showing DR levels set according to an embodiment of the present invention.

Referring to FIG. 7, DR levels set for each of electronic devices (an air conditioner, a refrigerator, a TV, and a Light Emitting Diode (LED) lighting) are shown. It is set that a corresponding device operates normally when a DR level is low and consumes low power when a DR level is high. The number of DR levels and operations of an electronic device according to the DR levels may be changed.

Thereafter, the level of the power consumption amount per electronic device is set based on the RTP information. Specifically, a DR level per electronic device is set according to an RTP level.

FIG. 8 is a table showing DR levels per electronic device, which are set according to RTP levels, according to an embodiment of the present invention.

Referring to FIG. 8, each electronic device is set to operate in a DR level according to a predetermined RTP level. For example, the air conditioner is set to operate in a DR level 1 in a case of the RTP level 1, a DR level 2 in a case of the RTP level 2, a DR level 3 in a case of the RTP level 3, a DR level 4 in a case of the RTP level 4. The DR levels per electronic device, which are set according to RTP levels, are set according to a characteristic of each electronic device. For example, LED lighting operates in the DR level 1 in a case of the RTP levels 1, 2, and 3.

Referring back to FIG. 6, in step 630, the apparatus for displaying power consumption receives current power consumption amounts of a plurality of electronic devices existing outside. Since step 630 is identical to step 130 of FIG. 1, a detailed description thereof is omitted.

In step 640, the apparatus for displaying power consumption creates at least one character setup command based on the set level of the power consumption amount of a corresponding electronic device and the received current power consumption amount of the corresponding electronic device. Specifically, the apparatus for displaying power consumption compares the set level of the power consumption amount of the corresponding electronic device with the received current power consumption amount thereof, and if the received current power consumption amount does not match the set level of the power consumption amount, the apparatus for displaying power consumption creates at least one character setup command. For example, with reference to FIGS. 7 and 8, when the TV normally operates in the DR level 1 in a case of the RTP level 1, if the RTP level 1 is changed to the RTP level 2, the TV is supposed to operate in the DR level 2. However, since the TV currently operates in the DR level 1, a current power consumption amount does not match the set level of the power consumption amount. Therefore, the apparatus for displaying power consumption creates a character setup command indicating that the power consumption amount of the TV is large. Alternatively, the apparatus for displaying power consumption creates a character setup command indicating that the power consumption amount of the TV is large by changing a parameter of a character according to the power consumption amount from the character set as a default. By changing the parameter, the character may be changed to indicate that the power consumption amount of the TV is large. In an embodiment of the present invention, the character may be an avatar. When a power consumption amount of the air conditioner does not match a power consumption amount level, an avatar set as a default may be changed to an avatar with a runny nose or another expression, and when a power consumption amount of the refrigerator does not match a power consumption amount level, the avatar set as a default may be changed to an avatar with stomach trouble or another expression, and when a power consumption amount of the TV does not match a power consumption amount level, the avatar set as a default may be changed to an avatar with glasses or another expression. A shape of the avatar may be arbitrarily set by a user or a manufacturer.

In step 650, the apparatus for displaying power consumption displays a character according to a character setup command. If a plurality of character setup commands are created in step 640, the created character setup commands are applied to the character.

FIG. 9 is a diagram illustrating an avatar. Referring to FIG. 9, if a received power consumption amount of the TV does not match a set power consumption amount level, an avatar 901 in a normal state is changed to an avatar 902 with glasses. If received power consumption amounts of the TV and the air conditioner do not match respective set power consumption amount levels, an avatar 903 with glasses and a runny nose is displayed.

Referring back to FIG. 6, in step 660, if a current power consumption amount does not match a corresponding power consumption amount level, the apparatus for displaying power consumption displays an image for identifying a mismatched electronic device.

In step 670, the apparatus for displaying power consumption displays a control screen for the electronic device indicated by the image based on a user input for the image of the electronic device. The control screen may be set by a manufacturer. If the apparatus for displaying power consumption is a touch screen, the control screen may be activated when the user touches the image of the electronic device or selects a specific button in a previous application screen.

In step 680, the apparatus for displaying power consumption creates a power consumption amount change command for allowing a corresponding electronic device to operate according to a power consumption amount matching a corresponding power consumption amount level. For example, when the TV normally operates in the DR level 1 in a case of the RTP level 1, if the RTP level 1 is changed to the RTP level 2, the TV is supposed to operate in the DR level 2. However, when the TV operates in the DR level 1, the apparatus for displaying power consumption creates a power consumption amount change command for operating the TV in the DR level 2.

Figure 10:
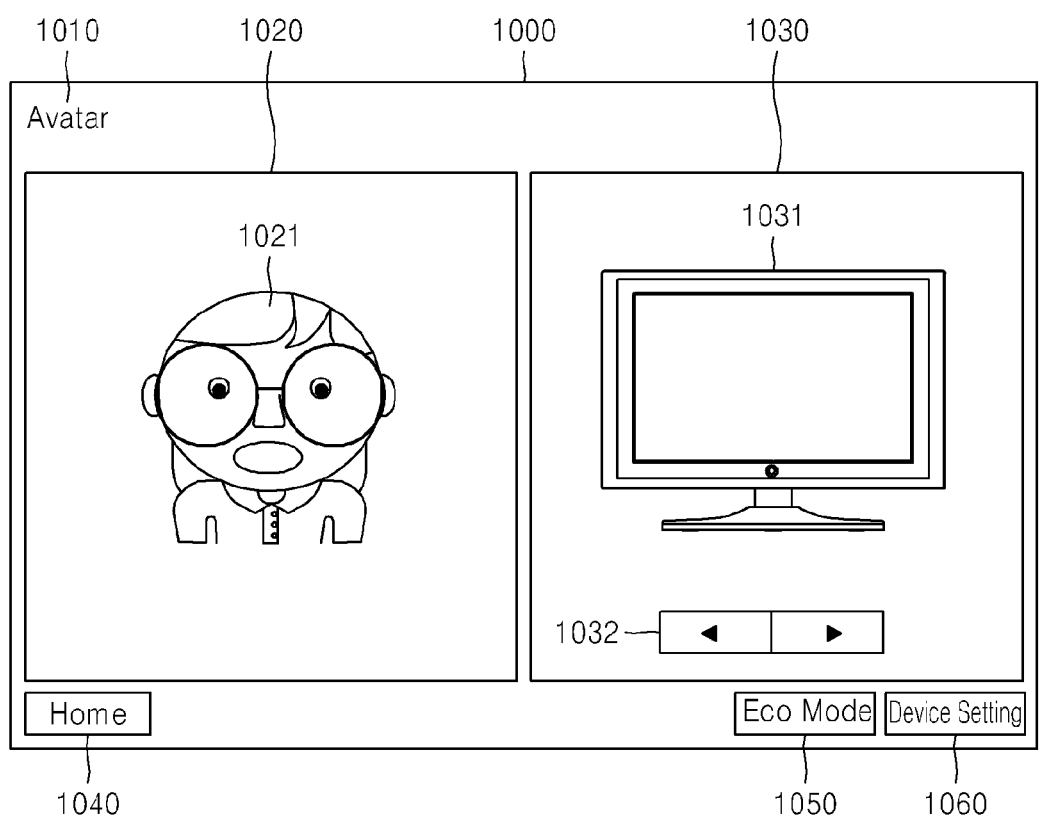
FIG. 10 is a diagram illustrating a display screen on which an image of an electronic device corresponding to a screen on which an avatar is displayed is further displayed.

FIG. 10 is a diagram illustrating a display screen on which an image of an electronic device corresponding to a screen on which an avatar is displayed is further displayed.

Referring to FIG. 10, a power consumption displaying application 1000 displays a power consumption displaying application title 1010. An avatar 1021 is displayed in a left window 1020, and an electronic device, i.e., an image 1031 of the TV, corresponding to the avatar 1021, is displayed in a right window 1030. If a plurality of electronic devices correspond to the avatar 1021, images of the plurality of electronic devices are displayed where the images may be sequentially displayed by using a direction key 1032. Of course, all the electronic devices may be displayed. The power consumption displaying application 1000 provides a 'Home' button 1040 for returning to a previous menu, an 'Eco Mode' button 1050 for automatically setting a DR level of a corresponding electronic device according to an RTP level, and a 'Device Setting' button 1060 for setting detailed functions of an electronic device indicated by a displayed image.

Figure 11:
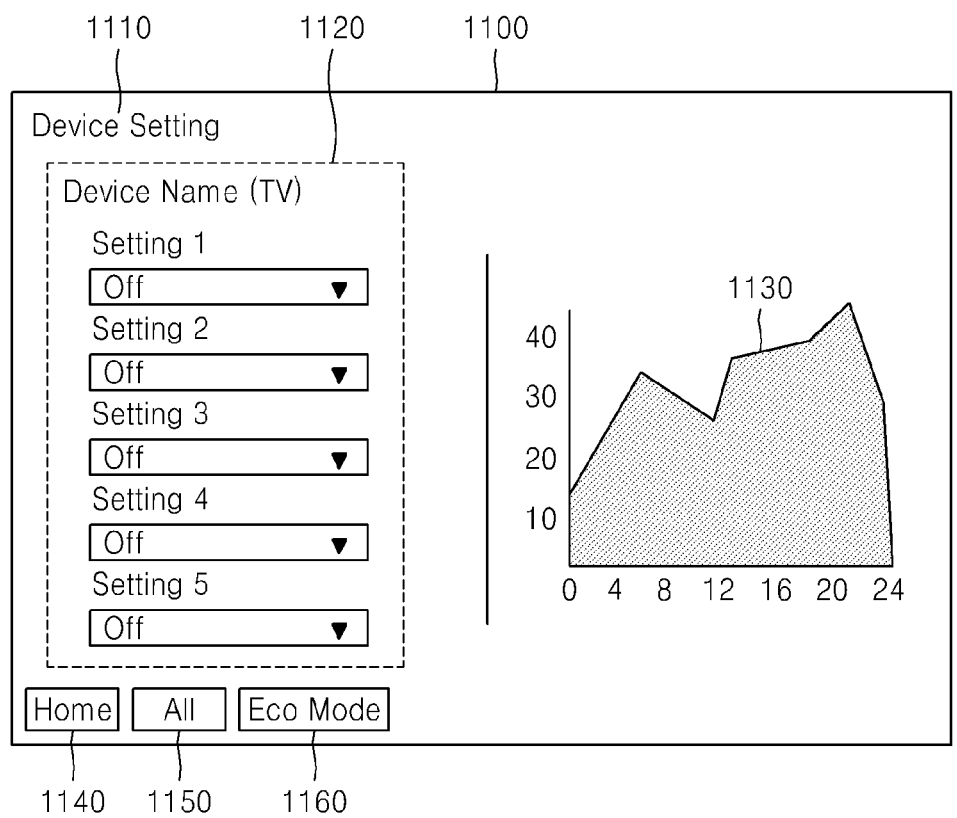
FIG. 11 is a diagram illustrating a control screen for an electronic device.

FIG. 11 is a diagram illustrating a control screen 1100 for an electronic device.

Referring to FIG. 11, a control screen title 1110 is displayed on the control screen 1100 for the electronic device. The control screen 1100 for the electronic device may provide a control button 1120 for controlling various detailed functions of the electronic device. A power consumption amount graph 1130 may be displayed on the control screen 1100 for the electronic device. The power consumption amount may be a current or accumulated power consumption amount according to time. The control screen 1100 for the electronic device may provide a 'Home' button 1140 and an 'Eco Mode' button 1160 having the same functions as those of FIG. 10 and may further provide an 'All' button 1150 for moving to a total energy information window.

Figure 12:
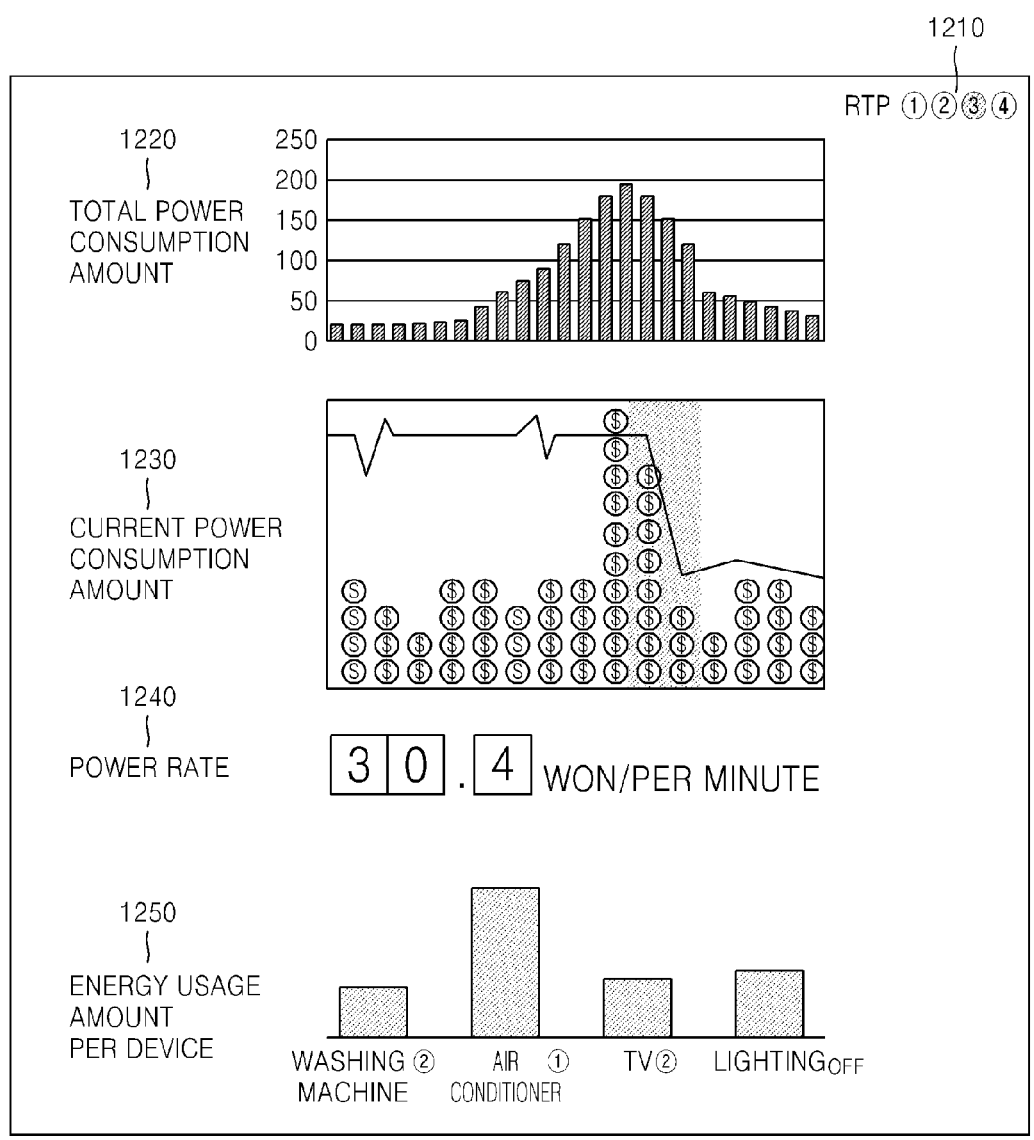
FIG. 12 is a diagram illustrating a total energy information window.

FIG. 12 is a diagram illustrating a total energy information window.

Referring to FIG. 12, a current RTP level 1210, a total power consumption amount 1220, a current power consumption amount 1230, a power rate 1240, and an energy usage amount per device 1250 are shown in the total energy information window.

Referring back to FIG. 6, in step 690, the apparatus for displaying power consumption creates a character diary. Specifically, the apparatus for displaying power consumption may display the character over time for a first period based on a second period shorter than the first period. The apparatus for displaying power consumption may automatically store an avatar whenever a power consumption amount of each electronic device is large during a predetermined period, and provide the stored avatars in a form of a diary.

Figure 13:
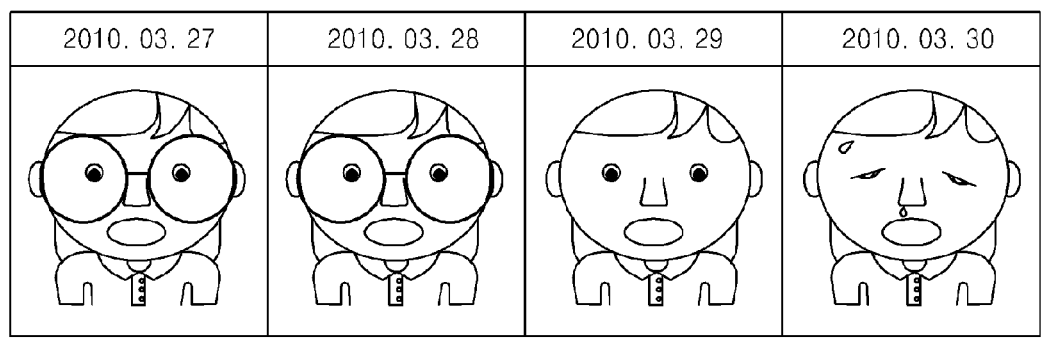
FIG. 13 is a diagram illustrating a portion of an avatar diary according to an embodiment of the present invention.

FIG. 13 is a diagram illustrating a portion of an avatar diary according to an embodiment of the present invention.

Referring to FIG. 13, displaying an avatar with glasses in first and second days, indicates that a power consumption amount of the TV is above a predetermined level, and displaying an avatar set as a default in a third day, indicates that the power consumption amount of the TV is below the predetermined level, and displaying an avatar with a runny nose in a fourth day, indicates that a power consumption amount of the refrigerator is above the predetermined level.

Although not shown, when an RTP level is changed in a screen on which an avatar is displayed, a background screen of the avatar may be changed.

Figure 14:
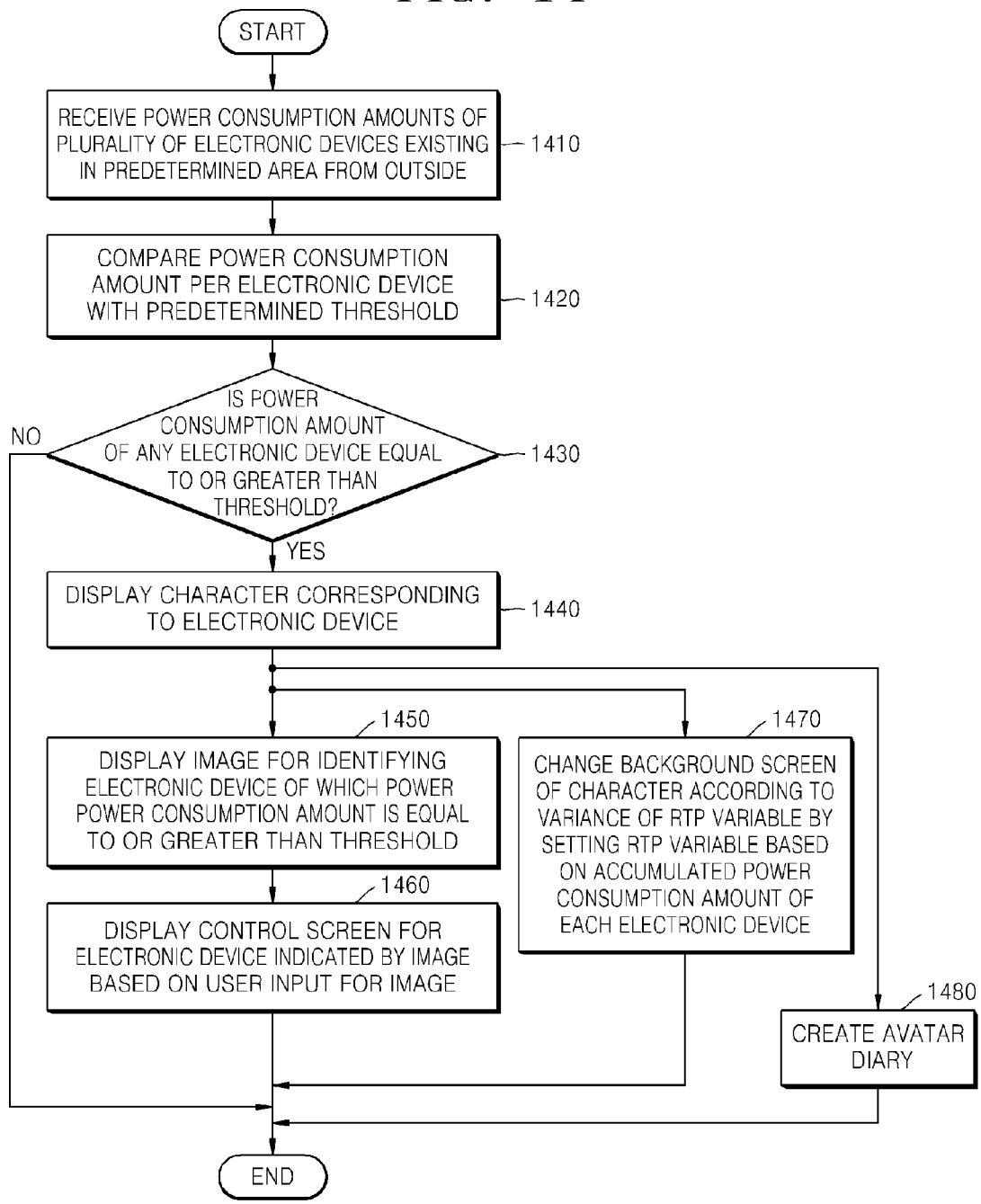
FIG. 14 is a flow diagram illustrating a method of displaying power consumption, according to another embodiment of the present invention.

FIG. 14 is a flow diagram illustrating a method of displaying power consumption, according to another embodiment of the present invention.

Referring to FIG. 14, in step 1410, an apparatus for displaying power consumption receives power consumption amounts of a plurality of electronic devices existing in a predetermined area from the outside through a predetermined communication network.

In step 1420, the apparatus for displaying power consumption compares the power consumption amount per electronic device with a predetermined threshold. The power consumption amount may be a current power consumption amount of each electronic device, which is received from the outside, or a power consumption amount of each electronic device, which is accumulated for a predetermined period.

The threshold indicates predetermined power consumption amount information of each electronic device in an area different from the predetermined area of step 1410. The threshold may be average power consumption amount information in other houses for each electronic device, average power consumption amount information in the same houses based on population statistics, or an average power consumption amount per electronic device for a predetermined period, which is stored in the apparatus for displaying power consumption. These are only examples, and the present invention is not limited thereto. The threshold may be arbitrary set by a user or a manufacturer of the apparatus for displaying power consumption.

In step 1430, if a power consumption amount of any electronic device is equal to or greater than the threshold, the apparatus for displaying power consumption proceeds to step 1440, otherwise if the power consumption amounts of the plurality of electronic devices are less than the threshold, the apparatus for displaying power consumption ends the method of displaying power consumption.

In step 1440, if a power consumption amount of any electronic device is equal to or greater than the threshold, the apparatus for displaying power consumption displays a predetermined character corresponding to the electronic device of which the power consumption amount is equal to or greater than the threshold. For example, if a power consumption amount of the air conditioner is equal to or greater than the threshold, the apparatus for displaying power consumption displays a character indicating that the power consumption amount of the air conditioner is large. Alternatively, the apparatus for displaying power consumption may change a character set as a default to the character indicating that the power consumption amount of the air conditioner is large, by changing a parameter of the character according to the power consumption amount. In an embodiment of the present invention, the character displayed may include an avatar. As an embodiment of the present invention, when a power consumption amount of the air conditioner is equal to or greater than the threshold, an avatar set as a default may be changed to an avatar with a runny nose or another expression, and when a power consumption amount of the refrigerator is equal to or greater than the threshold, the avatar set as a default may be changed to an avatar with stomach trouble or another expression, and when a power consumption amount of the TV or a Personal Computer (PC) is equal to or greater than the threshold, the avatar set as a default may be changed to an avatar with glasses or another expression, and when a power consumption amount of a printer is equal to or greater than the threshold, the avatar set as a default may be changed to an avatar holding paper or another expression, and when a power consumption amount of a heater or boiler is equal to or greater than the threshold, the avatar set as a default may be changed to a sweating avatar or another expression. The shape of the avatar may be arbitrarily set by a user or a manufacturer.

In step 1450, the apparatus for displaying power consumption may further display an image for identifying the electronic device of which the power consumption amount is equal to or greater than the threshold. If a plurality of electronic devices of which the power consumption amount is equal to or greater than the threshold exist, the apparatus for displaying power consumption may further display images of the plurality of electronic devices.

In step 1460, the apparatus for displaying power consumption displays a control screen for the electronic device indicated by the image based on user input for the image of the electronic device. The control screen may be set by a manufacturer. If the apparatus for displaying power consumption is a touch screen, the control screen may be activated when the user touches the image of the electronic device or selects a specific button in a previous application screen.

In step 1470, the apparatus for displaying power consumption changes a background screen of the displayed character according to a variance of an RTP variable by setting the RTP variable based on an accumulated power consumption amount of each electronic device. That is, the apparatus for displaying power consumption changes the background screen of the displayed character according to a variance of the above-described DR level. For example, when the variance of the DR level is small, the apparatus for displaying power consumption changes a color of the background screen to a color slightly different from a present color of the background screen, and when the variance of the DR level is large, the apparatus for displaying power consumption changes the color of the background screen to a color quite different from the present color of the background screen. Here, the user may intuitively recognize a change of the DR level instead of recognizing the change of the DR level according to a simple numerical value change.

In step 1480, the apparatus for displaying power consumption creates an avatar diary. Specifically, the apparatus for displaying power consumption may display the character over time for a first period based on a second period shorter than the first period. The apparatus for displaying power consumption may automatically store an avatar whenever a power consumption amount of each electronic device is large during a predetermined period, and provide the stored avatars in a form of a diary.

Figure 15:
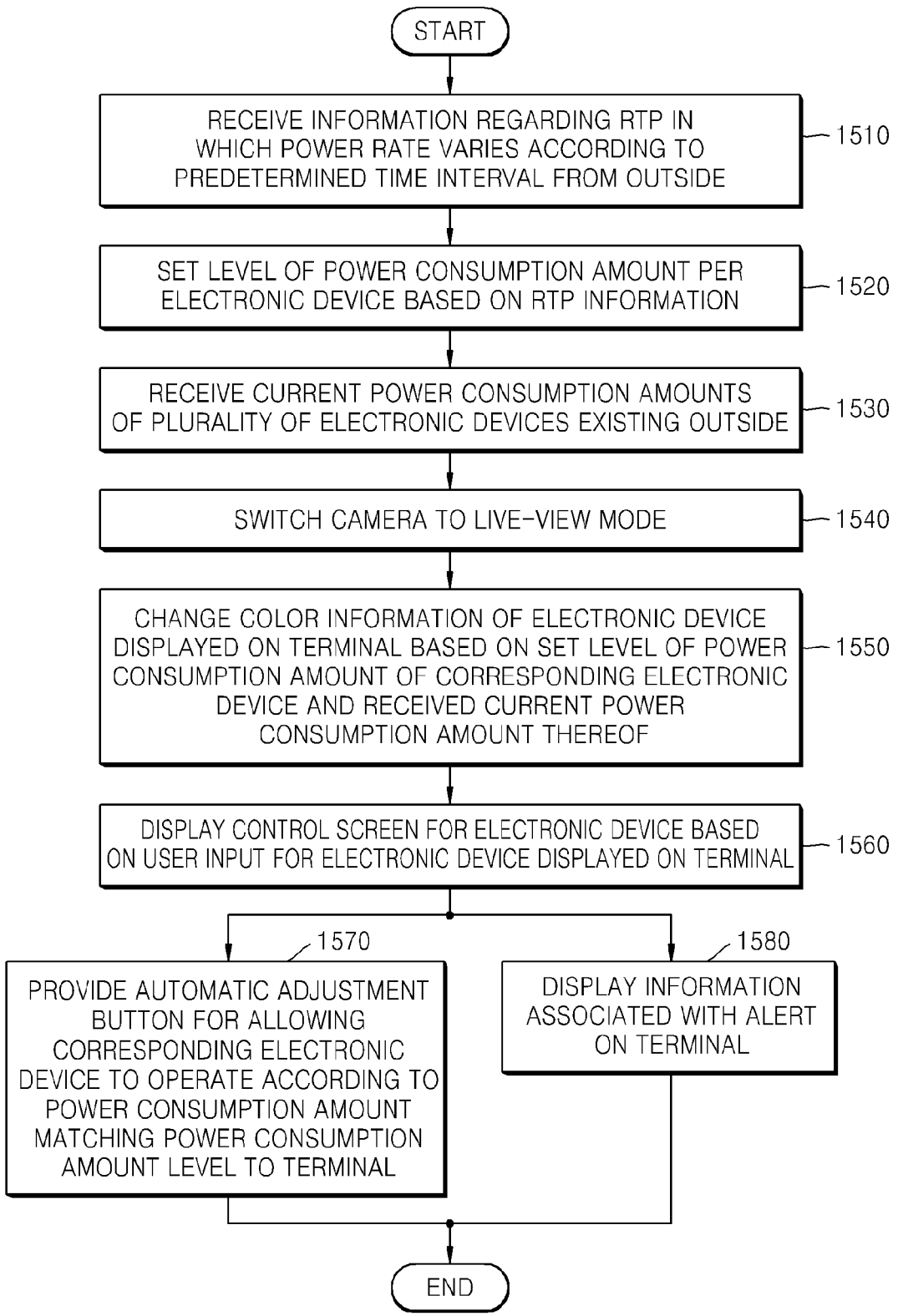
FIG. 15 is a flow diagram illustrating a method of displaying power consumption, according to another embodiment of the present invention.

FIG. 15 is a flow diagram illustrating a method of displaying power consumption, according to another embodiment of the present invention.

Referring to FIG. 15, since steps 1510 to 1530 are identical to steps 610 to 630 of FIG. 6, a description thereof is omitted.

In step 1540, an apparatus for displaying power consumption or a user switches a camera to a live-view mode where a terminal may use viewing technology such as Augmented Reality. As another embodiment of the present invention, the terminal including the camera may start from step 1540 without performing steps 1510 to 1530.

In step 1550, the apparatus for displaying power consumption changes color information (e.g., in the order of green, yellow, and red) of an electronic device displayed on the terminal according to a received power consumption amount per electronic device. For example, if a power consumption amount of the air conditioner is large, the apparatus for displaying power consumption may change a color of a displayed image of the air conditioner.

In step 1560, the apparatus for displaying power consumption may further display a control screen for the electronic device based on user input for the electronic device displayed on the terminal. Since step 1560 is similar to step 670 of FIG. 6, a detailed description thereof is omitted.

In step 1570, the apparatus for displaying power consumption provides an automatic adjustment button for readjusting a power consumption amount of the electronic device in a pre-set manner. That is, if the user pushes the automatic adjustment button, the apparatus for displaying power consumption may readjust the power consumption amount of the electronic device in an area. That is, the apparatus for displaying power consumption may provide the automatic adjustment button for allowing a corresponding electronic device to operate according to a power consumption amount matching a power consumption amount level to the terminal.

In step 1580, the apparatus for displaying power consumption may display information associated with an alert on the terminal. As another embodiment of the present invention, step 1580 may be first performed in FIG. 15.

Figure 16:
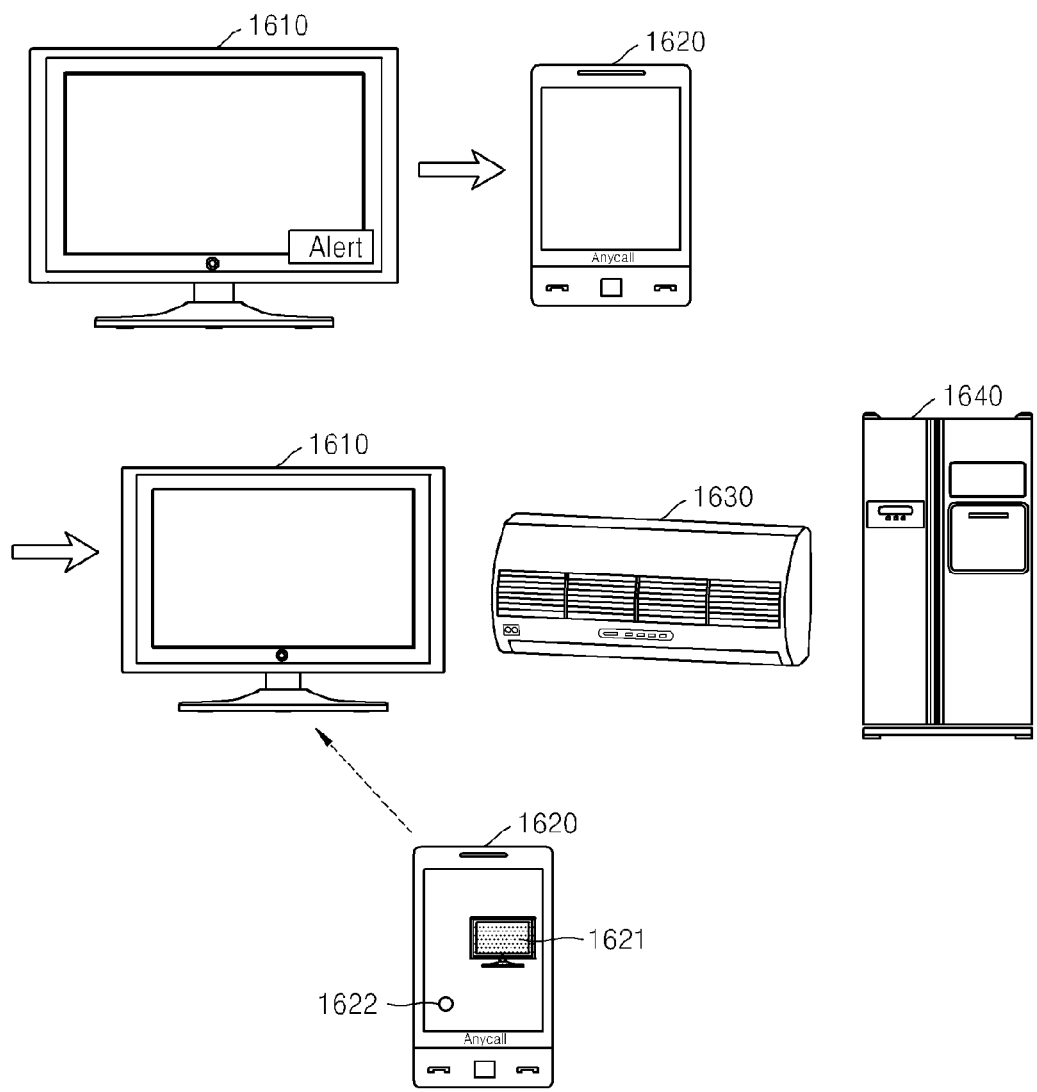
FIG. 16 is a diagram illustrating an implementation of the method of FIG. 15.

FIG. 16 is an implementation of the method of FIG. 15.

Referring to FIG. 16, if a power consumption amount of an electronic device in a house increases, information associated with an alert according to the increase of the power consumption amount is displayed on a TV 1610. Here, a user of a mobile device 1620 operates a camera included in the mobile device 1620 in the live-view mode. Electronic devices 1610, 1620, and 1630 in the house are displayed on the mobile device 1620 through the camera. When the electronic device of which the power consumption amount is large, the TV 1610 in this implementation, is displayed, a color of a TV identifier 1621 displayed on a screen is changed. Thus, the user may intuitively recognize the electronic device of which the power consumption amount is large. In addition, the mobile device 1620 has an automatic adjustment button 1622 for readjusting the power consumption amount of the electronic device in a pre-set manner.

Figure 17:
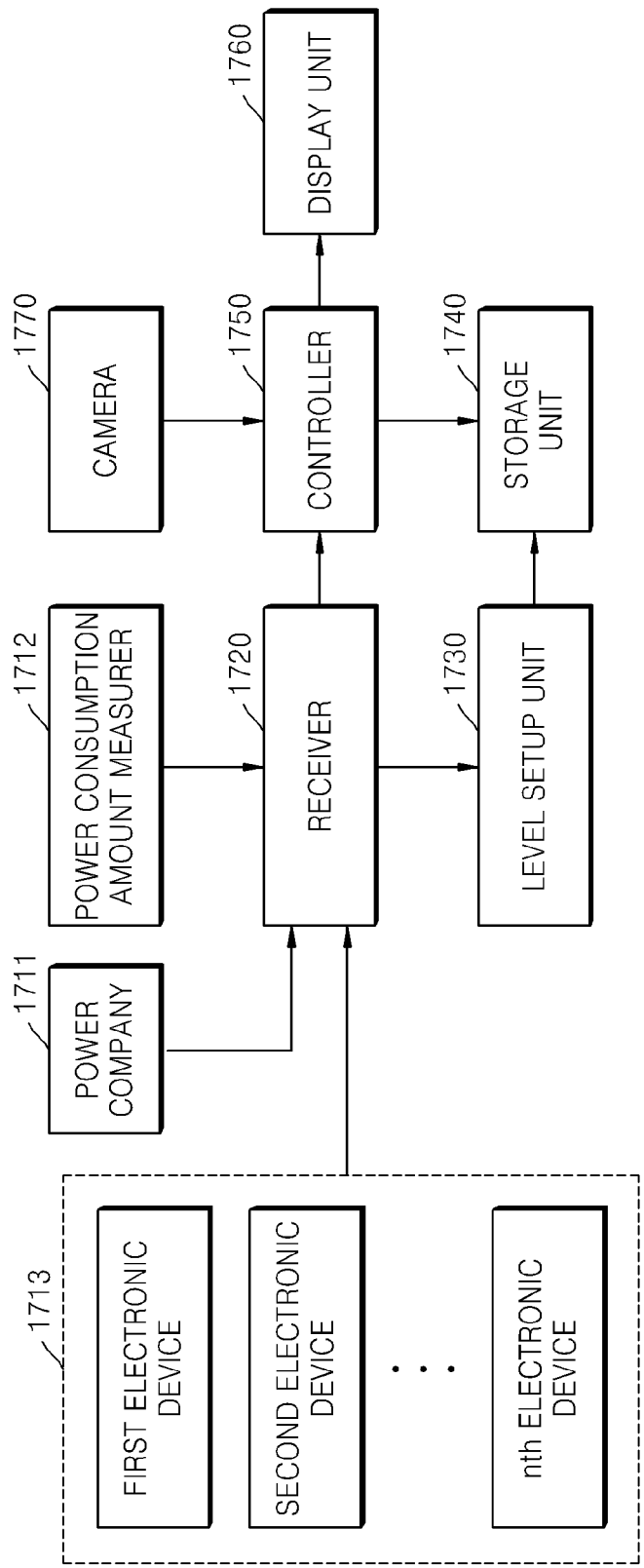
FIG. 17 is a block diagram of an apparatus for displaying power consumption according to an embodiment of the present invention.

FIG. 17 is a block diagram of an apparatus for displaying power consumption according to an embodiment of the present invention.

Referring to FIG. 17, the apparatus for displaying power consumption may include a receiver 1720, a level setup unit 1730, a storage unit 1740, a controller 1750, a display unit 1760, and a camera 1770. The apparatus for displaying power consumption is not limited to any device only if it is an apparatus capable of receiving power consumption from the outside and displaying power consumption information.

In one embodiment of the apparatus for displaying power consumption, the receiver 1720 receives information regarding RTP in which a power rate varies according to a predetermined time interval from a power company 1711 or a main agent related to the power company 1711. RTP means a power rate according to time, which is defined by the power company 1711. The receiver 1720 may receive a total power consumption amount of electronic devices from a power consumption amount measurer 1712. The receiver 1720 may receive current power consumption information of a plurality of electronic devices existing outside.

The level setup unit 1730 sets a level of the RTP information according to a predetermined criterion. The level setup unit 1730 stores the set RTP level in the storage unit 1740.

The controller 1750 displays an image indicating a variance of an RTP level through the display unit 1760. The image may be implemented by a flash animation. That is, the image may be implemented by an image changed according to the RTP level. If the RTP level is changed from the RTP level 1 to the RTP level 2, a power rate per hour increases. If a user sets a target amount for a power rate, a problem may occur to the target amount, so an image for indicating a problem to an increase in a power rate per hour or a user target amount may be displayed.

In another embodiment of the apparatus for displaying power consumption, the receiver 1720 receives information regarding RTP in which a power rate varies according to a predetermined time interval from the power company 1711 or a main agent related to the power company 1711. RTP means a power rate according to time, which is defined by the power company 1711. The receiver 1720 may receive a total power consumption amount of electronic devices from the power consumption amount measurer 1712. The receiver 1720 may receive current power consumption information of a plurality of electronic devices existing outside.

The level setup unit 1730 sets a level of a power consumption amount per electronic device based on the RTP information. First, the level setup unit 1730 sets a level of the RTP information according to a predetermined criterion and sets a criterion level of a power consumption amount per electronic device. The criterion level of a power consumption amount per electronic device may be defined by a manufacturer or a user of each electronic device. In an embodiment of the present invention, the criterion level of a power consumption amount per electronic device indicates a DR level, i.e., a level of a price to a current power demand. The level setup unit 1730 sets the level of a power consumption amount per electronic device based on the RTP level. Specifically, the level setup unit 1730 sets a DR level per electronic device according to the RTP level. The set levels are stored in the storage unit 1740.

The controller 1750 creates at least one character setup command based on the set level of a power consumption amount of a corresponding electronic device and the received current power consumption amount of the corresponding electronic device. Specifically, the controller 1750 compares the set level of the power consumption amount of the corresponding electronic device with the received current power consumption amount thereof, and if the received current power consumption amount does not match the set level of the power consumption amount, the controller 1750 creates at least one character setup command. For example, when a TV normally operates in the DR level 1 in a case of the RTP level 1, if the RTP level 1 is changed to the RTP level 2, the TV is supposed to operate in the DR level 2. However, since the TV currently operates in the DR level 1, a current power consumption amount does not match the set level of the power consumption amount. Here, the controller 1750 creates a character setup command indicating that the power consumption amount of the TV is large. Alternatively, the controller 1750 creates a character setup command indicating that the power consumption amount of the TV is large by changing a parameter of a character according to the power consumption amount from the character set as a default. By changing the parameter, the character may be changed to indicate that the power consumption amount of the TV is large. In an embodiment of the present invention, the character may be an avatar. As an embodiment of the present invention, when a power consumption amount of an air conditioner does not match a power consumption amount level, an avatar set as a default may be changed to an avatar with a runny nose or another expression, and when a power consumption amount of a refrigerator does not match a power consumption amount level, the avatar set as a default may be changed to an avatar with stomach trouble or another expression, and when a power consumption amount of the TV does not match a power consumption amount level, the avatar set as a default may be changed to an avatar with glasses or another expression. A shape of the avatar may be arbitrarily set by the user or a manufacturer.

The display unit 1760 displays a character according to a character setup command. If a plurality of character setup commands are created, the display unit 1760 displays the character by applying the created character setup commands to the character.

If a current power consumption amount does not match a corresponding power consumption amount level, the controller 1750 displays an image for identifying a mismatched electronic device through the display unit 1760. In addition, the controller 1750 displays a control screen for the electronic device indicated by the image based on user input for the image of the electronic device. The control screen may be set by a manufacturer. If the apparatus for displaying power consumption is a touch screen, the control screen may be activated when the user touches the image of the electronic device or selects a specific button in a previous application screen.

The controller 1750 creates a power consumption amount change command for allowing a corresponding electronic device to operate according to a power consumption amount matching a corresponding power consumption amount level.

For example, when the TV normally operates in the DR level 1 in a case of the RTP level 1, if the RTP level 1 is changed to the RTP level 2, the TV is supposed to operate in the DR level 2. However, when the TV operates in the DR level 1, the controller 1750 creates a power consumption amount change command for operating the TV in the DR level 2.

The controller 1750 creates a character diary where the controller 1750 may display the character over time for a first period based on a second period shorter than the first period. The apparatus for displaying power consumption may automatically store an avatar whenever a power consumption amount of each electronic device is large during a predetermined period, and provide the stored avatars in a form of a diary.

In another embodiment of the apparatus for displaying power consumption, the receiver 1720 receives power consumption amounts of a plurality of electronic devices existing in a predetermined area from the outside through a predetermined communication network.

The controller 1750 compares the power consumption amount per electronic device with a predetermined threshold. The power consumption amount may be a current power consumption amount of each electronic device, which is received from the outside, or a power consumption amount of each electronic device, which is accumulated for a predetermined period. The threshold indicates predetermined power consumption amount information of each electronic device. The threshold may be average power consumption amount information in other houses for each electronic device, average power consumption amount information in the same houses based on population statistics, or an average power consumption amount per electronic device for a predetermined period, which is stored in the apparatus for displaying power consumption. These are only examples, and the present invention is not limited thereto. The threshold may be arbitrary set by a user or a manufacturer of the apparatus for displaying power consumption. If a power consumption amount of any electronic device is equal to or greater than the threshold, the controller 1750 displays through the display unit 1760 a predetermined character corresponding to the electronic device of which the power consumption amount is equal to or greater than the threshold. For example, if a power consumption amount of the air conditioner is equal to or greater than the threshold, the controller 1750 displays through the display unit 1760 a character indicating that the power consumption amount of the air conditioner is large. Alternatively, the controller 1750 may change a character set as a default to the character indicating that the power consumption amount of the air conditioner is large, by changing a parameter of the character according to the power consumption amount. In an embodiment of the present invention, the character may be an avatar. A shape of the avatar may be arbitrarily set by a user or a manufacturer.

The controller 1750 may further display through the display unit 1760 an image for identifying the electronic device of which the power consumption amount is equal to or greater than the threshold. If a plurality of electronic devices of which the power consumption amount is equal to or greater than the threshold exist, the controller 1750 may further display images of the plurality of electronic devices through the display unit 1760. The controller 1750 displays a control screen for the electronic device indicated by the image through the display unit 1760 based on user input for the image of the electronic device. The control screen may be set by a manufacturer. If the apparatus for displaying power consumption is a touch screen, the control screen may be activated when the user touches the image of the electronic device or selects a specific button in a previous application screen.

The controller 1750 changes a background screen of the displayed character according to a variance of an RTP variable by setting the RTP variable based on an accumulated power consumption amount of each electronic device. That is, the controller 1750 changes the background screen of the displayed character according to a variance of the above-described DR level. For example, when the variance of the DR level is small, the controller 1750 changes a color of the background screen to a color slightly different from a present color of the background screen, and when the variance of the DR level is large, the controller 1750 changes the color of the background screen to a color quite different from the present color of the background screen. The user may intuitively recognize a change of the DR level instead of recognizing the change of the DR level according to a simple numerical value change.

The controller 1750 may create an avatar diary. Specifically, the controller 1750 may display the character over time for a first period based on a second period shorter than the first period. The controller 1750 may automatically store an avatar whenever a power consumption amount of each electronic device is large during a predetermined period, and provide the stored avatars in a form of a diary.

In another embodiment of the apparatus for displaying power consumption, where a description of the receiver 1720 and the level setup unit 1730 is identical to that described in the previous embodiment, the controller 1750 switches a camera 1770 to a live-view mode and a terminal may use viewing technology such as Augmented Reality. According to another embodiment of the present invention, the apparatus for displaying power consumption, which includes the camera 1770, may switch the camera 1770 to the live-view mode after receiving only information indicating that power consumption of an electronic device is not normal through the receiver 1720.

The controller 1750 changes color information (e.g., in the order of green, yellow, and red) of the electronic device displayed through the display unit 1760 according to a received power consumption amount per electronic device. For example, if a power consumption amount of the air conditioner is large, the controller 1750 may change a color of a displayed image of the air conditioner.

The controller 1750 may further display a control screen for the electronic device through the display unit 1760 based on user input for the electronic device displayed on the terminal and provides an automatic adjustment button for readjusting a power consumption amount of the electronic device in a pre-set manner. For example, if the user pushes the automatic adjustment button, the controller 1750 may readjust the power consumption amount of the electronic device in an area. That is, the controller 1750 may provide the automatic adjustment button for allowing a corresponding electronic device to operate according to a power consumption amount matching a power consumption amount level.

The display unit 1760 may display information associated with an alert. The alert may be first performed in the current embodiment.

The method of displaying power consumption can also be embodied as computer readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer readable code is stored and executed in a distributed fashion. Also, functional programs, codes, and code segments for accomplishing the present invention can be easily construed by programmers skilled in the art to which the present invention pertains.

While the present invention has been shown and described with reference to certain embodiments above, it will be understood by those skilled in the art that various changes in form and detail may be made therein without departing from the spirit and scope of the invention as defined by the appended claims.

What is claimed is:

1. A method of displaying power consumption, the method comprising:
receiving information regarding Real Time Pricing (RTP) in which a power rate varies according to time;
setting a level of a power consumption amount for each electronic device of a plurality of electronic devices based on the RTP information;
receiving power consumption amounts of at least one of the plurality of electronic devices; and
displaying a character based on the set level of the power consumption amount for the each electronic device and the received power consumption amounts, and an image for indicating an electronic device corresponding to the character; and
displaying a control screen for the electronic device indicated by the image based on user input associated with the image.

2. The method of claim 1, further comprising setting a level of the RTP information according to a predetermined reference,
wherein displaying of the character comprises displaying an image indicating the degree of change in the level.

3. The method of claim 1, wherein the displaying of the character comprises creating at least one character setup command based on the set level of the power consumption amount for the each electronic device and the received current power consumption amounts, and the character is displayed according to the at least one character setup command.

4. The method of claim 3, wherein creating the at least one character setup command comprises:
comparing the set level of the power consumption amount for the each electronic device with the received current power consumption amounts; and
if a mismatched electronic device exists for which the current power consumption amount does not match the level of the power consumption amount, creating the at least one character setup command for the mismatched electronic device.

5. The method of claim 3, wherein displaying the character comprises, if a plurality of character setup commands are created, displaying the character by applying the plurality of character setup commands to the character.

6. The method of claim 4, further comprising, if a mismatched electronic device exists, for which the current power consumption amount does not match the level of the power consumption amount, creating a power consumption amount change command for allowing the mismatched electronic device to operate according to a power consumption amount matching the level of the power consumption amount.

7. The method of claim 4, further comprising:
creating a command for changing a background screen of the displayed character according to a reset level of the power consumption amount; and
displaying the changed background screen of the character according to the command for changing a background screen.

8. The method of claim 3, wherein creating the at least one character setup command comprises:
setting a parameter for modifying the character;
determining the parameter based on the set level of the power consumption amount for the each electronic device with the received current power consumption amounts; and
creating at least one character setup command according to the determined parameter.

9. The method of claim 3, further comprising:
comparing the set level of the power consumption amount for the each electronic device with the received current power consumption amounts; and
if a mismatched electronic device exists, for which the current power consumption amount does not match the level of the power consumption amount, displaying an image for identifying the mismatched electronic device.

10. The method of claim 3, further comprising displaying the character over time for a first period based on a second period shorter than the first period.

11. The method of claim 3, wherein the character includes an avatar.

12. A method of displaying power consumption in a terminal comprising a camera, the method comprising:
receiving information regarding Real Time Pricing (RTP) in which a power rate varies according to a predetermined time interval;
setting a level of a power consumption amount for each electronic device of a plurality of electronic devices based on the RTP information;
receiving power consumption amounts of at least one electronic device of the plurality of electronic devices;
switching the camera to a live-view mode by using augmented reality;
changing color information of an electronic device displayed on the terminal based on the set level of the power consumption amount for the each electronic device and the received power consumption amounts; and
providing an automatic control button for allowing the each electronic device to operate according to a power consumption amount matching the level of the power consumption amount.

13. The method of claim 12, wherein changing the color information of the electronic device comprises:
comparing the set level of the power consumption amount for the each electronic device with the received current power consumption amounts; and
if a mismatched electronic device exists, for which the current power consumption amount does not match the level of the power consumption amount, changing color information of the mismatched electronic device.

14. The method of claim 12, further comprising displaying a control screen for the electronic device displayed on the terminal based on a user input associated with the electronic device.

15. The method of claim 13, further comprising displaying information associated with an alert on the terminal.

16. An apparatus for displaying power consumption, the apparatus comprising:
- a receiver for receiving information regarding Real Time Pricing (RTP) in which a power rate varies according to time and power consumption;
- a level setup unit for setting a level of a power consumption amount for each electronic device of a plurality of electronic devices based on the RTP information;
- a controller for creating a character based on the set level of the power consumption amount for each electronic device and the received power consumption amounts; and
- a display unit for displaying the character and an image for indicating an electronic device corresponding to the character, wherein the controller displays a control screen for the electronic device indicated by the image on the display unit based on user input associated with the image.

17. The apparatus of claim 16, wherein the level setup unit sets a level of the RTP information according to a predetermined reference, and
- the display unit displays the character comprises displaying an image indicating the degree of change in the level.

18. The apparatus of claim 16, wherein the controller creates at least one character setup command based on the set level of the power consumption amount for the each electronic device and the received current power consumption amounts, and
- the display unit displays the character according to the at least one character setup command.

19. The apparatus of claim 18, wherein the controller compares the set level of the power consumption amount for the each electronic device with the received current power consumption amounts, and if a mismatched electronic device exists, for which the current power consumption amount does not match the level of the power consumption amount, creates the at least one character setup command for the mismatched electronic device.

20. The apparatus of claim 18, wherein if a plurality of character setup commands are created, the display unit displays the character by applying the plurality of character setup commands to the character.

21. The apparatus of claim 18, wherein the controller compares the set level of the power consumption amount for the each electronic device with the received current power consumption amounts, and if a mismatched electronic device exists, for which the current power consumption amount does not match the level of the power consumption amount, creates a power consumption amount change command for allowing the mismatched electronic device to operate according to a power consumption amount matching the level of the power consumption amount.

22. The apparatus of claim 20, wherein the controller creates a command for changing a background screen of the displayed character according to a reset level of the power consumption amount, and
- the display unit displays the changed background screen of the character according to the command for changing a background screen.

23. The apparatus of claim 18, wherein the controller sets a parameter for modifying the character, determines the parameter based on the set level of the power consumption amount for the each electronic device with the received current power consumption amounts, and creates at least one character setup command according to the determined parameter.

24. The apparatus of claim 19, wherein the controller compares the set level of the power consumption amount for the each electronic device with the received current power consumption amounts, and if a mismatched electronic device exists, for which the current power consumption amount does not match the level of the power consumption amount, an image for identifying the mismatched electronic device is displayed on the display unit.

25. The apparatus of claim 18, wherein the controller displays the character over time for a first period based on a second period shorter than the first period.

26. The apparatus of claim 18, wherein the character includes an avatar.

27. An apparatus for displaying power consumption in a terminal comprising a camera, the apparatus comprising:
- a receiver for receiving information regarding Real Time Pricing (RTP) in which a power rate varies according to a predetermined time interval and power consumption amounts of at least one of electronic device;
- a level setup unit for setting a level of a power consumption amount for each electronic device of a plurality of electronic devices based on the RTP information; and
- a controller for switching the camera to a live-view mode by using augmented reality, changing color information of an electronic device displayed on the terminal based on the set level of the power consumption amount for the each electronic device and the received power consumption amounts, and providing an automatic control button for allowing the each electronic device to operate according to a power consumption amount matching the level of the power consumption amount.

28. The apparatus of claim 27, wherein the controller changes color information of a corresponding electronic device displayed on the terminal based on the set level of the power consumption amount of the corresponding electronic device and the received current power consumption amount thereof.

29. The apparatus of claim 28, wherein the controller compares the set level of the power consumption amount of the corresponding electronic device with the received current power consumption amount thereof, and if the current power consumption amount does not match the level of the power consumption amount, the controller changes color information of the corresponding electronic device, which is displayed on the terminal.

30. The apparatus of claim 28, further comprising a display unit for displaying a control screen for the corresponding electronic device displayed on the terminal based on user input associated with the corresponding electronic device.

31. The apparatus of claim 29, wherein the controller provides information associated with an alert to the display unit for the corresponding electronic device.

32. A non-transitory computer-readable recording medium storing a computer-readable program for executing a method of displaying power consumption, the method comprising:
- receiving information regarding Real Time Pricing (RTP) in which a power rate varies according to time;
- setting a level of a power consumption amount for each electronic device of a plurality of electronic devices based on the RTP information;
- receiving power consumption amounts of at least one of the plurality of electronic devices;
- displaying a character based on the set level of the power consumption amount for the each electronic device and the received power consumption amounts, and an image for indicating an electronic device corresponding to the character; and displaying a control screen for the electronic device indicated by the image based on user input associated with the image.

33. A non-transitory computer-readable recording medium storing a computer-readable program for executing a method of displaying power consumption in a terminal comprising a camera, the method comprising:

receiving information regarding Real Time Pricing (RTP) in which a power rate varies according to a predetermined time interval;

setting a level of a power consumption amount for each electronic device of a plurality of devices based on the RTP information;

receiving power consumption amounts of at least one of the plurality of devices;

switching the camera to a live-view mode by using augmented reality;

changing color information of an electronic device displayed on the terminal based on the set level of the power consumption amount for the each electronic device and the received power consumption amounts; and providing an automatic control button for allowing the each electronic device to operate according to power consumption amount matching the level of the power consumption amount.

* * * * *